(12) United States Patent
Hautala

(10) Patent No.: US 9,070,854 B2
(45) Date of Patent: *Jun. 30, 2015

(54) TECHNIQUES FOR PATTERNING MULTILAYER MAGNETIC MEMORY DEVICES USING ION IMPLANTATION

(71) Applicant: Varian Semiconductor Equipment Associates, Inc., Gloucester, MA (US)

(72) Inventor: John J. Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/861,017

(22) Filed: Apr. 11, 2013

(65) Prior Publication Data

US 2013/0288393 A1    Oct. 31, 2013

Related U.S. Application Data

(60) Provisional application No. 61/639,184, filed on Apr. 27, 2012.

(51) Int. Cl.
*H01L 43/12* (2006.01)
*H01L 27/22* (2006.01)
*H01L 43/02* (2006.01)

(52) U.S. Cl.
CPC ............ *H01L 43/02* (2013.01); *H01L 43/12* (2013.01); *H01L 27/222* (2013.01)

(58) Field of Classification Search
CPC .......................... H01L 43/02; H01L 27/222

USPC ........... 216/22; 257/E43.006, E43.001; 438/3
See application file for complete search history.

(56) References Cited

U.S. PATENT DOCUMENTS

| | | | |
|---|---|---|---|
| 6,169,688 B1* | 1/2001 | Noguchi | 365/171 |
| 2001/0040778 A1* | 11/2001 | Abraham et al. | 360/324.2 |
| 2009/0214898 A1* | 8/2009 | Hinoue et al. | 428/848.5 |
| 2011/0143170 A1* | 6/2011 | Gouk et al. | 428/846 |
| 2012/0000885 A1* | 1/2012 | Sakurai et al. | 216/22 |
| 2012/0175342 A1 | 7/2012 | Sinclair et al. | |
| 2013/0084653 A1* | 4/2013 | Rubin et al. | 438/3 |
| 2013/0155549 A1* | 6/2013 | Rubin et al. | 360/135 |
| 2013/0236987 A1* | 9/2013 | Patel et al. | 438/3 |

FOREIGN PATENT DOCUMENTS

| | | |
|---|---|---|
| EP | 0936624 A2 | 8/1999 |
| WO | 2005013376 A1 | 2/2005 |

OTHER PUBLICATIONS

International Search Report and Written Opinion dated Nov. 22, 2013 for PCT/US2013/036317 filed Apr. 12, 2013.

* cited by examiner

*Primary Examiner* — Christine Enad

(57) ABSTRACT

A method of patterning a substrate includes providing a layer stack comprising a plurality of layers on a base portion of the substrate, where the layer stack includes an electrically conductive layer and a magnetic layer. The method further includes forming a first mask feature on an outer surface of the layer stack above a first protected region and a second mask feature on the outer surface of the layer stack above a second protected region, and directing ions towards the layer stack to magnetically isolate and electrically isolate the first protected region from the second protected region.

15 Claims, 3 Drawing Sheets

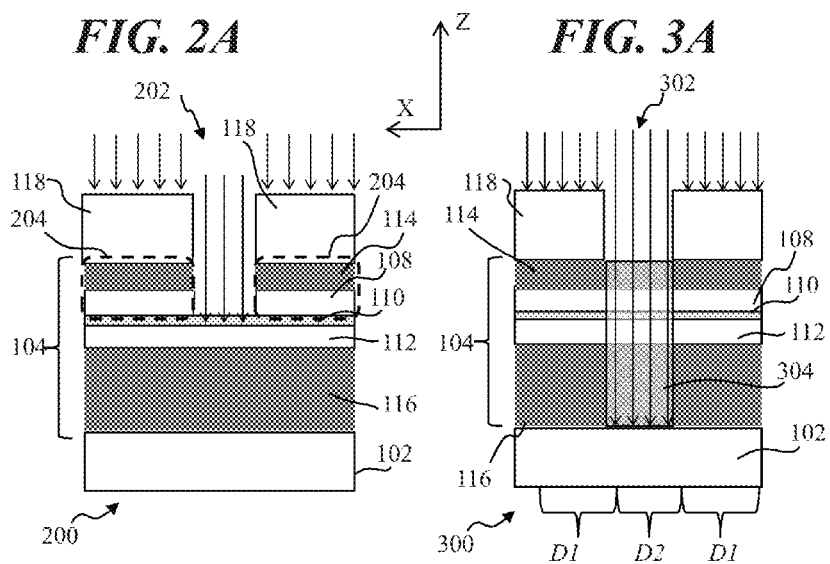

US 9,070,854 B2

TECHNIQUES FOR PATTERNING MULTILAYER MAGNETIC MEMORY DEVICES USING ION IMPLANTATION

RELATED APPLICATIONS

This application claims priority to U.S. provisional patent application No. 61/639,184 filed Apr. 27, 2012.

FIELD

Embodiments relate to the field of non-volatile storage. More particularly, the present embodiments relate to a method, system and structure for patterning a magnetic substrate using ion implantation.

BACKGROUND

The fabrication of conventional storage media including non-volatile memory devices, faces many challenges as storage density increases and individual memory storage cell size decreases. Magnetic random access memory devices have several attractive features. Unlike conventional random access memory chip technologies, in MRAM data is not stored as electric charge or current flows, but by magnetic storage elements. Moreover, unlike dynamic random access memory, MRAM devices are all non-volatile and do not require refreshing to preserve the memory state of a cell.

In a simple version, the storage elements are formed from two ferromagnetic plates, each of which can hold a magnetic field, separated by a thin insulating layer. One of the two plates is a permanent magnet set to a particular polarity, the other's field can be changed to match that of an external field to store memory. This configuration is known as a spin valve and is the simplest structure for a MRAM bit. A memory device is built from a grid of such "cells".

The simplest method of reading is accomplished by measuring the electrical resistance of the cell. A particular cell is typically selected by powering an associated transistor that switches electric current from a supply line through the cell to ground. Due to the magnetic tunnel effect the electrical resistance of the cell changes due to the orientation of the fields in the two plates. By measuring the resulting current, the resistance inside any particular cell can be determined, and from this the polarity of the writable plate. Typically if the two plates have the same polarity this is considered to mean "1", while if the two plates are of opposite polarity the resistance will be higher and this means "0".

A recent variant of MRAM, spin-transfer torque random-access memory, or STT-RAM, has the advantages of lower power consumption and better scalability over conventional magnetoresistive random access memory (MRAM), which uses magnetic fields to flip the active elements. Spin-transfer torque is an effect in which the orientation of a magnetic layer in a magnetic tunnel junction or spin valve can be modified using a spin-polarized current. The effects are usually most evident in nanometer scale devices. Accordingly, as device sizes of non-volatile memories scale to sub 100 nm dimensions, the use of STT-MRAM becomes more attractive.

Patterning of MRAM devices such as STT-MRAM may take place by defining a patterned mask that is formed on top of a stack of layers that contains at least two magnetic layers separated by an insulating layer. The patterned mask typically contains isolated mask features that expose regions of the substrate that lie between the mask features, which exposed regions are subsequently etched away. The remaining regions protected by the patterned mask features are unetched and define MRAM cells that are physically isolated from one another after etching. This patterning process entails many issues including the need to define individual memory cells by subtractive etching. For one, a typical MRAM cell does not have the shape of a vertical pillar in which the sidewalls are perpendicular to the plane of the substrate. Moreover, MRAM cells typically comprise many different layers having many different materials which provide a challenge for etching the layers to define MRAM cells. In addition, after etching, the sides of various layers in an MRAM cell may be subject to etching attack and/or deposition of unwanted material.

In view of the above, it will be appreciated that there is a need to improve patterning technologies to create patterned MRAM devices.

SUMMARY

Embodiments are directed to methods and structures for improved MRAM device performance. In one embodiment a method of patterning a substrate includes providing a layer stack comprising a plurality of layers on a base portion of the substrate, where the layer stack includes an electrically conductive layer and a magnetic layer. The method further includes forming a first mask feature on an outer surface of the layer stack above a first protected region and a second mask feature on the outer surface of the layer stack above a second protected region, and directing ions towards the layer stack to magnetically isolate and electrically isolate the first protected region from the second protected region.

In another embodiment, a method of forming a magnetic memory includes providing a layer stack comprising a plurality of layers on a base portion of a substrate, the plurality of layers comprising an electrically conductive layer and a magnetic layer. The method also includes, forming a plurality of mask features on a surface of the layer stack, and directing ions to the substrate at an ion dose and ion energy sufficient to magnetically isolate and electrically isolate a first protected region of the layer stack covered by a first mask feature of the plurality of mask features from a second protected region of the layer stack covered by a second mask feature of the plurality of mask features.

BRIEF DESCRIPTION OF THE DRAWINGS

FIGS. 2A-2B together depict another embodiment of MRAM device processing using ion implantation; and FIGS. 3A-3B together depict a further embodiment of MRAM device processing using ion implantation.

DETAILED DESCRIPTION

Figures 1A, 1B, 1C:
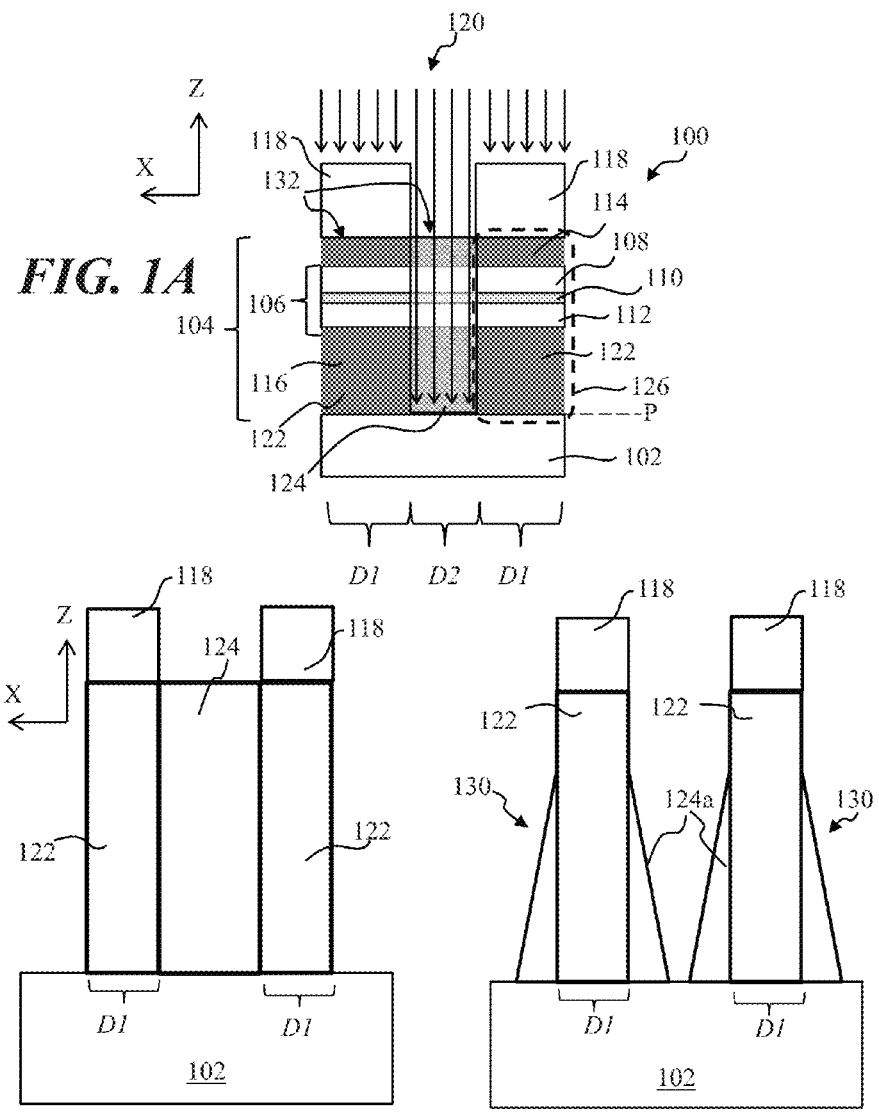
FIG. 1A depicts an embodiment of MRAM device processing using ion implantation.
FIGS. 1B and 1C depict alternative MRAM structures that may be formed using the processing of FIG. 1A.

The present disclosure will now be described more fully hereinafter with reference to the accompanying drawings, in which some embodiments are shown. The subject of this disclosure, however, may be embodied in many different forms and should not be construed as limited to the embodiments set forth herein. Rather, these embodiments are provided so that this disclosure will be thorough and complete, and will fully convey the scope of the subject of this disclosure to those skilled in the art. In the drawings, like numbers refer to like elements throughout.

To solve the deficiencies associated with the methods noted above, novel techniques for patterning a substrate are introduced. In particular, the present disclosure focuses on techniques involving ion implantation processes for patterning magnetic storage structures, such as MRAM, and more particularly STT-RAM. The methods disclosed herein may employ ion implantation processes alone or in conjunction with etching processes to define multiple MRAM cells within an MRAM array, where each MRAM cell includes a specific stack of layers. However, those of ordinary skill in the art will recognize that the techniques disclosed herein are not limited to use in conjunction with any particular etching process of particular stack of layers that define an MRAM cell.

The embodiments are also described as techniques using ion based substrate processing systems. However, those of ordinary skill in the art will recognize that other types of sub-atomic, atomic, or molecular particle based substrate processing systems, including plasma processing, as well as beam line ion implantation systems used to produce such particles, are within the scope of the present disclosure.

In various embodiments, processes for patterning magnetic storage cells involve blanket implantation of a substrate that includes a base and a stack of layers that comprise an MRAM storage element or MRAM cell. In various embodiments, the MRAM cell may be fabricated from a stack of layers (also referred to herein as a "layer stack") that is the same or similar to that of conventional MRAM devices, including conventional STT-RAM devices. The substrate to be implanted may include mask features disposed on an outer portion of the stack of layers disposed on a substrate so as to act as a mask to screen ions being implanted into the substrate. In this manner, during a blanket implantation process, portions of the layer stack disposed underneath the patterned features may remain partially or wholly protected from the implanting ions, while those portions of the layer stack that are not protected by the mask features may be implanted with ions. Consistent with various embodiments, the dose and energy of implanting ions may be used to optimize the process of fabricating an MRAM cell structure, and thereby may optimize the properties of individual MRAM cells and/or an array of MRAM cells.

As detailed below, the present embodiments address challenges for patterning complex layer stacks to form device such as MRAM devices. In particular, the present embodiments provide ion implantation operations to achieve a novel approach for non-volatile memory fabrication. For the purposes of illustration in some embodiments the combination of layers used to form a non-volatile memory may be depicted for specific MRAM device configurations. However, the present embodiments are not limited to any specific combination of layers to be used to fabricate an MRAM cell. In various embodiments, a layer stack to form an MRAM cell may be fabricated upon a substrate base consistent with known techniques. The terms "substrate base," "base portion," or "underlayer" refer herein to any substrate that contains any set of layers and/or structures upon which a layer stack to form an MRAM cell is formed. As will be apparent to those of ordinary skill in the art, the substrate underlayer, or base (portion), need not be planar and may include multiple different structures on its surface. However, in the FIGs. to follow, the portions of a substrate base upon which a layer stack of the MRAM device is formed is depicted as planar.

FIG. 1A depicts one embodiment of MRAM device processing using ion implantation. In particular, FIG. 1A illustrates a substrate 100 that includes a substrate base 102 upon which a layer stack 104 that includes a plurality of layers is disposed. In various embodiments the layer stack 104 includes a storage element portion that may include a first magnetic layer and a second magnetic layer separated by an electrically insulating layer. The layer stack 104 may also include an electrically conductive layer(s) that is used to contact a respective magnetic layer. Of course the first magnetic layer and second magnetic layer may also be electrically conductive. In the specific embodiment shown in FIG. 1A, the layer stack 104 includes a storage element portion 106 that contains a fixed layer 108 (which may be a CoFeB material that forms a first magnetic layer), MgO layer 110, which is an electrically insulating layer, reference layer 112 (which may also be a CoFeB layer that forms a second magnetic layer), and contact layers 114, 116, which are each an electrically conductive layer. Other layers within the layer stack 104 are not specifically depicted, but may include various additional layers including storage element layers and contact layers, as will be apparent to one of ordinary skill in the art.

In the embodiment of FIG. 1A, a mask, such as a hardmask, is patterned and disposed on an outer portion of the substrate 100. In particular a mask may include the mask features 118, which are formed on the outer surface 132 of the layer stack 104 and partially mask the layer stack 104. In the example of FIG. 1A there are shown a first mask feature to the left and a second mask feature to the right, each designated as a mask feature 118. However, it will be readily appreciated that the mask features 118 may comprise an array such as a two dimensional array of up to $10^6$-$10^{12}$ or greater number of mask features, which are each used to define an MRAM cell in an MRAM device. Ions 120 are directed toward the substrate 100, such that the ions 120 implant into the substrate 100 including in unmasked regions as well as in mask features 118. It is to be noted that the dimensions of any of the individual layers, mask features, or other features are not necessarily depicted to scale with respect to one another in either the X-direction or Z-direction. For example, the thickness of the masked features (in the Z-direction) may be relatively greater than the total thickness of the layer stack 104. Accordingly, the ion energy of ions 120 may be adjusted so that ions 120 implanting into mask features 118 may be attenuated within the mask features 118 without penetration to underlying portions of the layer stack 104, while at the same time ions 120 that directly strike the layer stack 104 where no mask feature 118 is present may penetrate through any desired thickness of the layer stack 104, including the entire thickness of the layer stack 104. The ions may be provided by a conventional beamline ion implantation system, a conventional plasma deposition (PLAD) apparatus, or any system for delivering ions to a substrate.

In various embodiments, including embodiments in which the ions 120 are produced in a beamline ion implantation system, the ions 120 may be directed as a substantially parallel beam of ions. In particular embodiments, the ions 120 may impinge upon the substrate 100 in a direction parallel to the Z-direction, that is, perpendicular to a surface of the substrate 100 that lies along the X-direction. In this manner, the ions 120 that impinge upon the substrate 100 may define one or more protected regions 122 having a width $D_1$ that are protected by the mask features 118, and one or more exposed regions 124 having a width $D_2$ that are altered by the ions 120. In the example of FIG. 1A there are shown a first protected region 122 to the left disposed under a respective mask feature 118, a second protected region 122 to the right disposed under a respective mask feature 118, and an exposed region 124 that represents an area not covered by either first mask feature 118 or second mask feature 118.

In particular embodiments, the ion species of ions 120, the ion energy, and ion dose of ions 120 are chosen such that the combination of ion species, ion energy, and ion dose render the exposed regions 124 magnetically "dead" after exposure to ions 120. This serves to magnetically isolate a protected region 122 from neighboring protected regions 122 so as to define a magnetic MRAM cell 126 whose width is $D_1$. The term "magnetically isolate" as used herein refers to transforming initially magnetic regions that surround a designated magnetic region, such as the protected region 261, into non-magnetic regions (magnetically dead regions). As illustrated in FIG. 4A, a magnetic region such at the protected region 122, may contain multiple layers, only some of which are magnetic. A magnetically isolated region having the proper stack of magnetic and non-magnetic layers may thereby form an MRAM cell that is isolated from other MRAM cells by the non-magnetic regions, such as exposed regions 124.

As shown in the embodiment of FIG. 1A, the ions 120 may impinge upon the substrate 100 at a perpendicular incidence with respect to a plane P of the substrate; accordingly, the width of the MRAM cell may be substantially uniform throughout its thickness in the Z-direction. In some embodiments, conditions for ions 120 may be chosen such that the combination of ion species, ion energy, and ion dose may also render all of the portions of layer in the exposed regions 124 electrically insulating, thereby also preventing any electrical short circuits between adjacent MRAM cells. Thus, the ions 120 may both magnetically isolate and electrically isolate a first protected region 122 (left portion of FIG. 1A) from a second protected region 122 (right portion of FIG. 1A), so that adjacent MRAM cells 126 are not only magnetically isolated from one another but are electrically isolated from one another so that they can properly function as independent memory elements. Accordingly, after implantation of ions 120 the layer stack 104 between adjacent MRAM cells need not be etched since each MRAM cell is electrically isolated from each other MRAM cell. Regarding embodiments such as that depicted in FIG. 1A where the implanted exposed regions 124 are not removed, it is to be noted that the required combination of ion dose/ion energy/ion species for magnetically deadening the exposed region may differ from a required combination for rendering the exposed region electrically insulating. Accordingly, the combination of ion/energy/ion dose/ion species to be used in such cases may be chosen based on the combination that performs both functions.

In some embodiments, in order to magnetically deaden the exposed regions of the layer stack 104, the ion dose of ions 120 is in the range of $2E15/cm^2$ to $5E17/cm^2$. Examples of ions 120 include nitrogen, oxygen, phosphorous, silicon. In various embodiments the ion energy of implanting ions may be in the range of about 3 KeV to about 20 KeV and may be tailored according to the implanting ion species and desired implant depth within the layer stack 104 for the implanting ion species.

Moreover, according to different embodiments the ions 120 may be provided as an ion treatment that is composed of one or more ion exposures. For example, an ion treatment may include two ion exposures: a first ion exposure using oxygen ions at a first ion energy and first ion dose; and a second ion exposure using nitrogen at a second ion dose and second ion energy, in which the second ion dose and/or second ion energy may differ from respective first ion dose and/or first ion energy. In this manner, different ion exposures may be tailored for different purposes. For example, a phosphorous ion exposure may be performed to implant phosphorous ions, which may be effective in particular to magnetically deaden exposed regions of the layer stack 104, and an oxygen ion exposure may be performed to implant oxygen ions, which may be effective to transform initially electrically conductive layers of the layer stack 104 into electrically insulating material, thereby electrically isolating protected regions 122 of layer stack 104. In particular variants, the phosphorous implantation may be performed prior to oxygen implantation, which may enhance the effectiveness of oxygen ion implantation in electrically isolating protected regions 122. The embodiments are not limited in this context.

In some embodiments the ions 120 are provided as a parallel beam of ions that is parallel to the Z-direction, that is, perpendicular to the plane of the substrate 100. An advantage of this approach to defining an MRAM cell is that the MRAM cell dimensions may be precisely defined regardless of processing to take place subsequent to the ion implantation. As detailed below with respect to the FIGs. to follow, the removal of material from exposed regions of a layer stack, such as layer stack 104, that lie between mask features 118 may be adjusted, and may be removed in a partial or an iterative fashion, which may result in MRAM cell structures that may vary in physical shape and size for a given MRAM cell size defined by the hard mask pattern. However, even though the physical MRAM cell structure varies according to the exact post-ion implantation processing recipe employed, the size and shape of "active" magnetic regions may be held constant, thus providing a more reliable technique for fabricating MRAM arrays. That is, the implantation of a parallel beam of ions in the presence of patterned mask features may precisely define the size and shape of magnetically deadened regions, and thereby define the size and shape of the magnetically active regions of each MRAM cell.

Thus, consistent with various embodiments in which implantation is used to magnetically deaden exposed regions of a layer stack, the physical size and shape of an MRAM cell structure that is eventually formed after ion implantation does not determine the size of the size of the magnetically active regions. This relaxes the requirements for etching and removal of material between MRAM cells, as illustrated in FIGS. 1B-1C. Following the example of FIG. 1A, FIG. 1B depicts a cross-sectional view of adjacent MRAM cells fabricated according to the process of FIG. 1A after ion implantation and removal of mask features 118. In this embodiment, no etching of the exposed regions 124 is performed after exposure to ions 120. However, the width $D_1$ of protected regions 122, which correspond to magnetically active regions since they are protected from change by mask features 118, is defined by the regions that are deadened by the ion implantation of ions 120, which takes place throughout the exposed regions 124, as noted above.

In addition, after the regions between mask features are exposed to ions to magnetically deaden the regions, such as the exposed regions 124, the width of portions that are rendered electrically insulating need not exactly correspond to the width of the magnetically deadened regions. In addition, in some instances the region of a layer stack exposed to ion implantation may be rendered electrically insulating without necessarily transforming a metal phase into an insulating phase by virtue of the ion implantation. For example, oxygen implantation may be effective in transforming electrically conductive layers that are initially continuous into isolated metallic islands that no longer provide an electrically conductive path between adjacent MRAM cells.

FIG. 1C depicts an embodiment in which the exposed regions 124 are etched down to the substrate base 102 after being subjected to the processing depicted in FIG. 1A, thereby forming the tapered MRAM cell structure 130. This may be desirable in order to ensure electrical isolation of MRAM cells from one another. However, as noted above, the complex nature of the multiple layers that constitute an MRAM device, such as an STT-RAM, typically make it difficult to etch MRAM cell structures that have vertical sidewalls. In prior art processes, which do not employ ion implantation, this causes difficulty in controlling MRAM device properties since the size and shape of magnetically active regions coincides with the size and shape of the physical MRAM cell. Thus, in the example of FIG. 1C, non-vertical MRAM cell structures are formed after etching of the exposed regions 124. This results in the formation of side regions 124a along opposite sides of the magnetically active region, that is, a protected region 122. However, because ion implantation of ions 120 magnetically deadens exposed regions 124 before etching (see FIG. 1A), the side regions 124a are also magnetically deadened. Thus, the magnetically active region, corresponding to protected region 122, is substantially the same size and shape as that in FIG. 1B where no post-ion implantation etching is performed. In this manner, after implantation of ions 120, the properties of the MRAM cell structures formed with or without subsequent etching are controlled by the mask features 118 and the ion implantation process and not by any etch processes, which may be among the least reliable processes for forming MRAM cell structures.

Another advantage provided by the MRAM cell structure 130 is that the (tapered) side regions 124a, which are previously implanted, may provide encapsulation to active device layers that eliminates the need to perform an additional step to seal the MRAM cell structure 130 from ambient attack. In addition, since the side regions 124a do not form part of the active MRAM cell, more aggressive etching and residue cleaning may be performed on the sides of the MRAM cell without concern that the active MRAM regions will be altered. It is to be noted that consistent with the present embodiments, the aforementioned processes be performed in a manner that maintains any insulating layers in side regions 124a as electrical insulators. For example, referring to FIG. 1A, an electrically insulating MgO layer 110 (not explicitly shown in FIG. 1C) may extend into the side region 124a. After ion implantation and any other processing, any portion of the MgO layer 110 present in side regions 124a is also maintained as an insulator, thereby ensuring that portions of adjacent metal layers such as fixed layer 108 and reference layer 112, that extend into the side region 124a, albeit magnetically deadened, are not electrically shorted to one another by a conducting portion of the MgO layer 110.

Figure 1D:
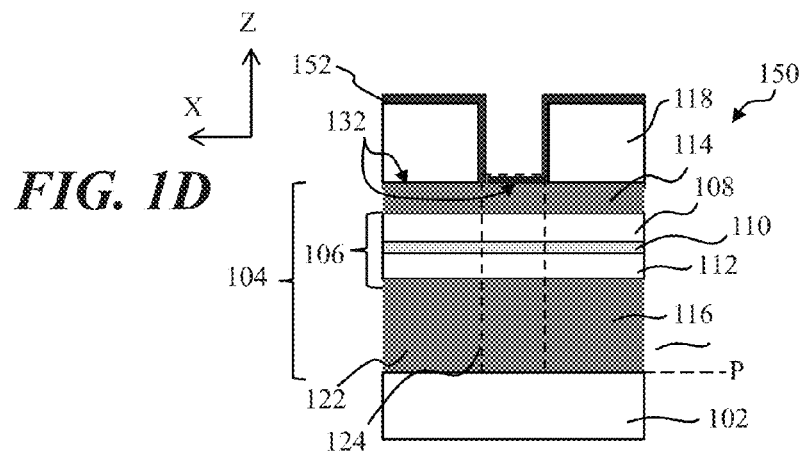
FIGS. 1D and 1E depict another embodiment of MRAM device processing using ion implantation.
Figure 1E:
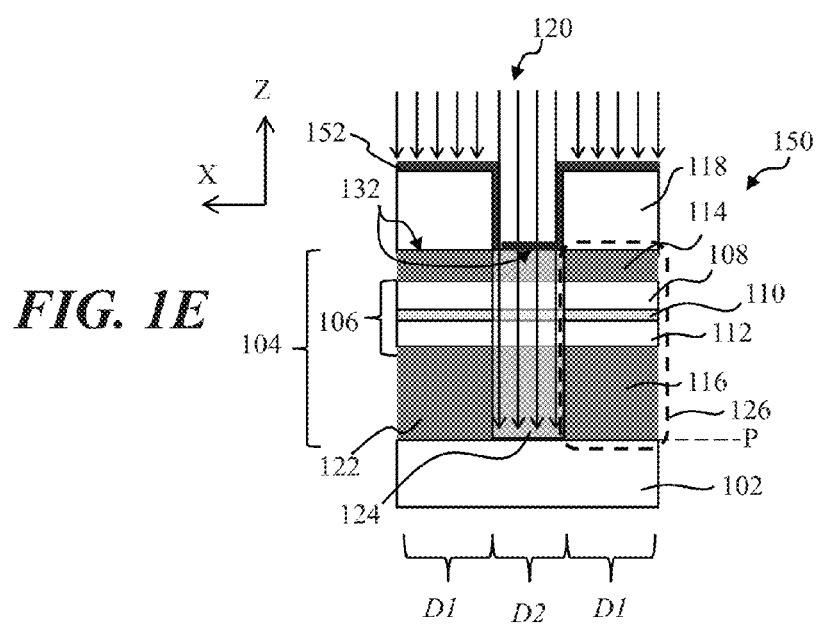

In cases in which it is desirable to prevent etching of exposed regions of a substrate that lie between hard mask features and are to be implanted to define the MRAM cells, the exposed regions may be coated with a protection layer before implantation. FIGS. 1D and 1E show one such variant in which a carbon layer 152 is deposited on the substrate 150 after the formation of hard mask features 118. The substrate 150 may be generally arranged with the same components as substrate 100, which are similarly labeled. The deposited carbon layer 152 may coat both the hard mask features 118 and the outer surface 132 of the layer stack 104. After deposition of the carbon layer 152, which may have a thickness in the range of 1 to 5 nm in some embodiments, ions 120 are directed to the substrate 150. The ions implant into the exposed regions 124, thereby defining MRAM cells 126 as described above. The carbon layer 152 may have a very low etch rate when subjected to ions 120 and may therefore remain at least partially intact during the implantation of ions 120. The remaining carbon layer 152 thereby protects the exposed regions 124 of the layer stack 104 from etching due to sputtering from ions 120 during implantation.

In further embodiments, a top layer or few layers of the layer stack may be etched before ions are implanted into a substrate to define MRAM cells. For example, it may be convenient to etch top layers in exposed regions between mask features 118 to a depth at which the sidewalls of MRAM cells being defined are still relatively steep, such that the lateral dimension along the X-direction still corresponds to the dimensions of the mask features 118. Subsequently, an exposure to ions to magnetically deaden exposed regions and render the exposed regions electrically insulating may require less energetic ions.

FIGS. 2A and 2B depict and embodiment in which the exposed regions of the layer stack 104 of substrate 200 are first subjected to etching ions 202 to etch the layer stack 104 until the top of an MgO layer 110. Upon exposure to the etching ions 202 the exposed portions of the layer stack 104 thereby form islands 204 that are isolated from one another as shown in FIG. 2A. Subsequently, as illustrated in FIG. 2B, exposure to ions 206 causes the ions 206 to implant throughout the exposed portions of the layer stack 104, thereby rendering the exposed portions 208 magnetically deadened and electrically insulating. Because the thickness of the remaining layers of the layer stack 104 is less than the embodiment of FIG. 1A when substrate 200 is exposed to ions 206, the energy and/or dose of the ions 206 may be reduced (and possibly the species of ions changed) as opposed to that employed for ions 120. This helps reduce the lateral straggle of ions 206 as opposed to that of ions 120, thereby serving to more accurately define the size of the MRAM cells 210 whose nominal width is defined by the width ($D_1$) of the mask features 118. In addition, the variability in width of MRAM cells 210 in the Z-direction as well as variability of width between MRAM cells may be improved.

FIGS. 3A and 3B depict a further embodiment for forming an MRAM cell. In this embodiment, ions are first implanted into exposed portions of a layer stack protected by a pattern of mask features in order to define the lateral MRAM cell dimensions. Subsequently, the exposed implanted portions of the layer stack are removed by etching, such as reactive ion etching, ion beam or reactive ion beam etching, leaving physically isolated MRAM cell structures.

In FIG. 3A, ions 302 are implanted into the exposed regions 304 of the layer stack 104 of substrate 300. Since the exposed regions 304 are to be subsequently removed, the ion dose, ion energy, and ion species may be chosen to render the exposed regions 304 more easily etchable in a subsequent etch. In FIG. 3B, ions 306 impinge upon the exposed regions 304 of the layer stack 104 and etch the exposed regions 304. Because the exposed regions 304 are chemically and/or physically altered by exposure to the ions 302, the exposed regions 304 may be more easily removed by RIE or IBE as compare to an untreated layer stack. As with the example of FIG. 1C, it is to be noted that the implanted regions, that is, the exposed regions 304, need not be completely removed since the width D2 of the magnetically dead region is defined by the implantation operation of FIG. 3A which does not depend upon the subsequent exposure to ions 306. As shown in FIG. 3B, regions 308 may remain along the sidewalls of the etched layer stack 104. An advantage of this approach is that the ions 302 do not have to render the layer stack 104 electrically insulating since at least a portion of the layers of the exposed layer stack is to be removed down to the substrate base 102 as shown in FIG. 3B, thereby physically isolating adjacent memory cells.

In further embodiments, a layer stack is iteratively implanted and etched in exposed regions. For example, referring again to FIG. 1A in an initial exposure ions may be implanted into the layers 114, 108 of the layer stack 104. Subsequently, etching ions may be directed toward the substrate 100 and etch away implanted portions of the layer stack 104. Ions may then be implanted into remaining portions of the exposed layer stack 104, followed by etching of the implanted remaining portions of the exposed layer stack 104. In various embodiments, the ions implanted into each exposed layer or set of layers to be etched may be tailored for that layer or set of layers. Depending on the composition and thickness of each layer to be etched, among other factors, it may be appropriate to change the type of implanting species. For example, a Ta or Ru layer may be implanted with a different species than an MgO layer. Moreover, such an iterative process may involve any desired number of iterations of etching and implanting. In addition, as with previously disclosed embodiments, the implanted portions of a layer stack that are implanted in an iterative process need not be removed completely along sidewalls of an MRAM cell since the MRAM cell width is defined by the implantation process itself and does not depend on whether or how much implanted material is subsequently removed.

Consistent with further embodiments, multi-angle ion treatment may be directed to a substrate having patterned hard mask features to define the initial MRAM cell structures. By providing ions over a range of angles, the shape and size of the MRAM cells to be formed in protected regions may be more precisely controlled. Examples of etching ions include, but are not limited to, Ar, F, Cl, O, or a combination of the same. The ions may be provided with a high degree of uniformity over a large range of ion energies.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of patterning a substrate comprising:
providing a layer stack comprising a plurality of layers on a base portion of the substrate, the layer stack comprising a plurality of initially electrically conductive layers and a magnetic layer;
forming a first mask feature on an outer surface of the layer stack above a first protected region and a second mask feature on the outer surface of the layer stack above a second protected region, wherein the first protected region and second protected region define an exposed region therebetween that is not covered by a mask feature;
directing ions towards the layer stack, wherein the ions are effective to magnetically isolate the first protected region from the second protected region, wherein the directing the ions comprises forming implanted regions of the layer stack within the plurality of electrically conductive layers and the magnetic layer in the exposed region; and
etching at least a portion of the implanted regions of the layer stack within the plurality of electrically conductive layers and the magnetic layer after formation of the implanted regions, wherein a tapered side region is formed from a remaining portion of the implanted regions, the tapered region being magnetically deadened, wherein the first protected region is magnetically isolated and electrically isolated from the second protected region, and wherein the first protected region is physically isolated from the second protected region.

2. The method of claim 1, comprising forming a carbon layer on the outer surface after the forming the first and second mask features and before the directing the ions.

3. The method of claim 1, wherein the ions provide an ion dose of $1E16/cm^2$ to $5E17/cm^2$.

4. The method of claim 3, wherein the ion are directed in a plurality of ion exposures.

5. The method of claim 1, wherein the ions have an ion energy in the range of 3 keV to 20 KeV.

6. The method of claim 1, wherein the directing the ions comprises:
providing a first ion species in a first ion exposure; and
providing a second ion species in a second ion exposure.

7. The method of claim 6, wherein the first ion exposure comprises a first ion energy and first ion dose, and the second ion exposure comprises a second ion energy and second ion dose, at least one of the second ion energy and second ion dose differing from the respective first ion energy and first ion dose.

8. The method of claim 6, wherein the first ion exposure comprises phosphorous ions and the second ion exposure comprises oxygen ions.

9. The method of claim 1, further comprising directing the ions at a perpendicular incidence with respect to a substrate plane.

10. The method of claim 1, wherein the layer stack comprises components of a magnetic random access memory including:
a first magnetic layer;
a second magnetic layer; and
an insulating layer adjacent the first magnetic layer and adjacent the second magnetic layer, and disposed between the first and second magnetic layer.

11. A method of forming a magnetic memory, comprising: providing a layer stack comprising a plurality of layers on a base portion of a substrate, the plurality of layers comprising a plurality of initially electrically conductive layers and a magnetic layer; forming a plurality of mask features on a surface of the layer stack, wherein a first mask feature of the plurality of mask features defines a first protected region of the layer stack and a second mask feature of the plurality of mask features defines a second protected region of the layer stack; and
directing ions to the substrate at an ion dose and ion energy sufficient to magnetically isolate the first protected region of the layer stack from the second protected region of the layer stack, wherein the directing the ions comprises forming implanted regions of the layer stack within the plurality of electrically conductive layers and the magnetic layer in the exposed region; and
etching at least a portion of the implanted regions within the plurality of electrically conductive layers and the magnetic layer after formation of the implanted regions, wherein a tapered side region is formed from a remaining portion of the implanted regions, the tapered region being magnetically deadened, wherein the first protected region is magnetically isolated and electrically isolate from the second protected region, and wherein the first protected region is physically isolated from the second protected region.

12. The method of claim 11, wherein the layer stack comprising:
a first magnetic layer;
a second magnetic layer; and
an electrically insulating layer adjacent the first magnetic layer and adjacent the second magnetic layer, and disposed between the first and second magnetic layer.

13. The method of claim 12, wherein the first and second magnetic layer each comprising a cobalt-containing material.

14. The method of claim 11, comprising directing the ions at a perpendicular incidence with respect to a substrate plane.

15. The method of claim 11, comprising directing the ions over a range of angles with respect to a plane of the substrate.

* * * * *